US006677754B2

(12) United States Patent
Kestler et al.

(10) Patent No.: US 6,677,754 B2
(45) Date of Patent: Jan. 13, 2004

(54) MAGNETIC RESONANCE INSTALLATION HAVING A TRAP FOR SUPPRESSING CURRENTS ON A CABLE SHIELD

(75) Inventors: Joachim Kestler, Pinzberg (DE); Arne Reykowski, Erlangen (DE); Jianmin Wang, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/072,090

(22) Filed: Feb. 8, 2002

(65) Prior Publication Data

US 2002/0109503 A1 Aug. 15, 2002

(30) Foreign Application Priority Data

Feb. 9, 2001 (DE) .......................................... 101 05 984

(51) Int. Cl.[7] .................................................. G01V 3/00
(52) U.S. Cl. ...................................... 324/322; 324/318
(58) Field of Search ................................ 324/318, 322, 324/307, 308, 309

(56) References Cited

U.S. PATENT DOCUMENTS

| 3,166,706 | A | * | 1/1965 | Bonnet et al. ............... 324/301 |
| 4,725,780 | A | * | 2/1988 | Yoda et al. .................. 324/318 |
| 4,739,271 | A | * | 4/1988 | Haase ......................... 324/322 |
| 4,922,204 | A | | 5/1990 | Duerr et al. |
| 4,945,321 | A | * | 7/1990 | Oppelt et al. ............... 333/119 |
| 5,473,252 | A | | 12/1995 | Renz et al. |
| 5,477,147 | A | | 12/1995 | Friedrich et al. |
| 5,742,165 | A | | 4/1998 | Snelten et al. |

* cited by examiner

Primary Examiner—Edward Lefkowitz
Assistant Examiner—Dixomara Vargas
(74) Attorney, Agent, or Firm—Schiff Hardin & Waite

(57) ABSTRACT

A magnetic resonance apparatus has magnet systems which respectively generate a basic magnetic field, gradient magnetic fields and a high-frequency magnetic field. A start element is connected to an end element via a coaxial cable. The coaxial cable is divided into at least two cable sections that are coupled to one another via a transformer having transformer coils. The transformer coils are directly connected to inner conductors of the respective coaxial cable sections and are connected to outer conductors of the respective coaxial cable sections via tuning capacitors.

7 Claims, 2 Drawing Sheets

MAGNETIC RESONANCE INSTALLATION HAVING A TRAP FOR SUPPRESSING CURRENTS ON A CABLE SHIELD

BACKGROUND OF THE INVENTION

1. Field of the Invention

The present invention is directed to a magnetic resonance installation of the type having magnet systems with which a basic magnetic field, gradient magnetic fields and a high-frequency magnetic field can be generated, and having a start element that is connected to an end element via a coaxial cable, the coaxial cable having an inner conductor and an outer conductor.

2. Description of the Prior Art

A magnetic resonance installation of the above type is disclosed, for example, by European Application 0 337 204, corresponding to U.S. Pat. No. 4,922,204.

A current may be induced in the outer conductors in the coaxial cables due to the variable high-frequency magnetic fields. Such currents are suppressed with traps.

In the trap known from European Application 0 337 204 the coaxial cable is wound as a toroid and a capacitor is connected in parallel with it. The toroid, which thus forms an inductor, is tuned with the capacitor to the basic frequency of the magnetic resonance installation. As a result, the high-frequency current on the outer conductor of the coaxial cable is interrupted.

The known trap is relatively narrow-band, and therefore must be set very exactly. The exact setting is often very difficult, particularly because of the intrinsic capacitance of the coaxial cable. Further, it must be assured that the frequency that has been set does not drift over time.

SUMMARY OF THE INVENTION

An object of the present invention is to provide a simple, reliable and economic arrangement that forms a broadband trap in a magnetic resonance installation.

This object is achieved in accordance with the invention in a magnetic resonance apparatus of the type initially described wherein the coaxial cable has at least two cable sections; that are coupled to one another via a transformer with transformer coils; with the transformer coils being directly connected to the inner conductors of the respective sections and being connected to the outer conductors of the respective sections via tuning capacitors.

When the high-frequency magnetic field exhibits a basic frequency and the transformer coils and the tuning capacitors form frequency filters tuned to the basic frequency, the trap is especially effective.

When the inner conductors and the outer conductors are galvanically connected to one another via high-frequency inductances, a signal transmission via the coaxial cable is also additionally possible in the low-frequency range, i.e. at frequencies considerably lower than the basic frequency.

When the high-frequency inductances galvanically connecting the inside and the outer conductors to one another have a middle region and two outside regions and the outside regions are connected to the outer conductors via auxiliary capacitors, the galvanic connection of outer conductor and inner conductor also contains a trap.

When the outside regions and the auxiliary capacitors form low-pass filters with a limit frequency that is lower then the basic frequency, this additional trap is also especially effective.

Low-frequency signals that the invention allows to be transmitted via the signal line are control signals that can be communicated between the start element and the end element via the coaxial cable.

The inventive arrangement is preferably utilized when the start element is a control and evaluation unit for the magnetic resonance installation and the end element is a local coil, because the coaxial cable is necessarily exposed to the high-frequency field in this case.

DESCRIPTION OF THE PREFERRED EMBODIMENTS

Figure 1:
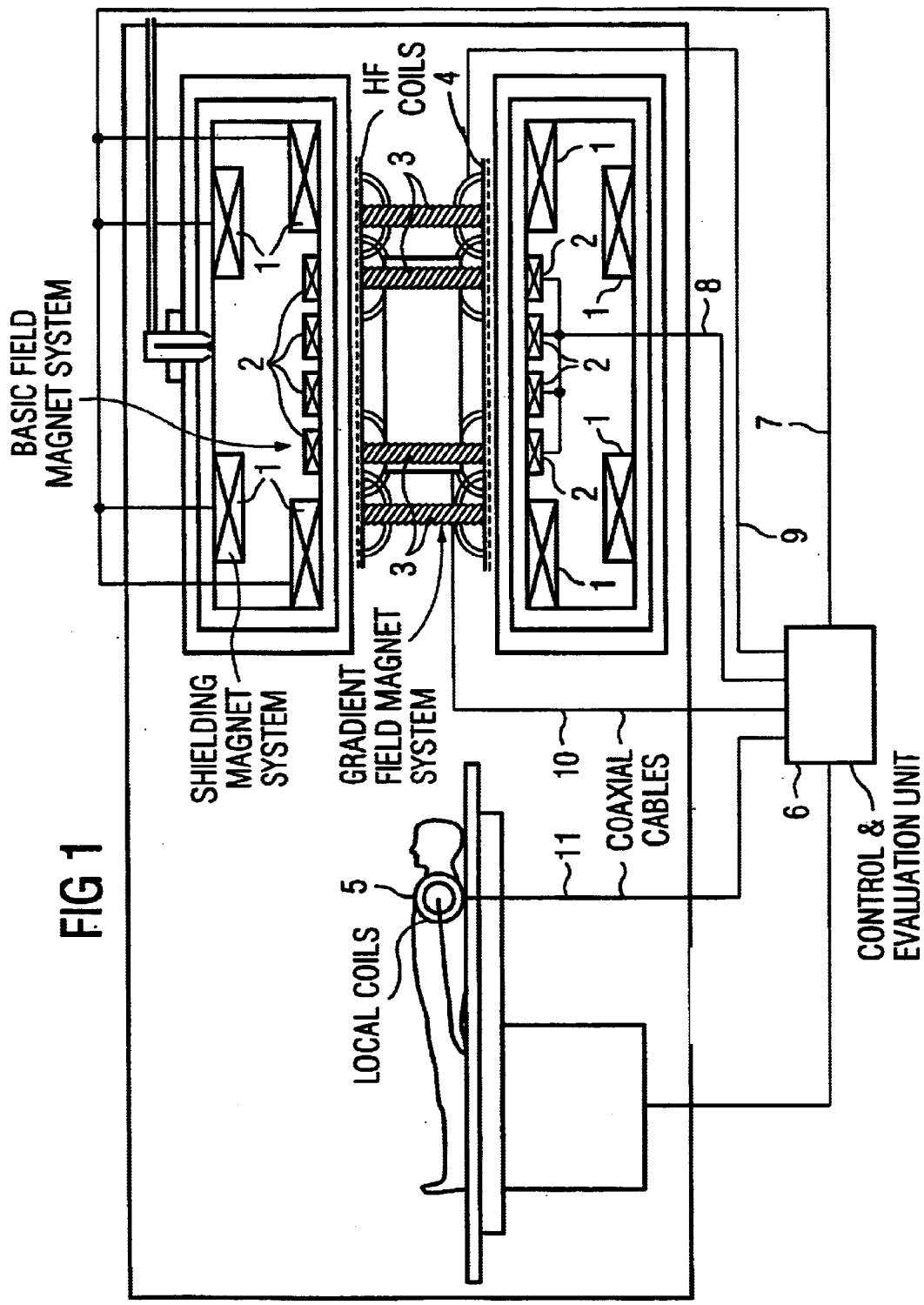
FIG. 1 is a block circuit diagram of a magnetic resonance installation in which a trap in accordance with the invention can be used.

As shown in FIG. 1, a magnetic resonance installation has a number of magnet systems 1 through 5. These are a shielding magnet system 1 and a field basic magnet system 2, a gradient field magnet system 3 and high-frequency coils 4 and local coils 5 forming an antenna system.

The interior of the magnetic resonance installation is shielded as far as possible from outer magnetic fields with the shield magnet 1. A basic magnetic field is generated with the basic magnet 2. Gradient magnetic fields are generated with the gradient magnet 3. The high-frequency coils 4 serve the purpose of generating a high-frequency magnetic field. Further, magnetic resonance signals are detected via the coils 4 and the local coils 5. The generated high-frequency magnetic field and the magnetic resonance signals exhibit a basic frequency that is defined by the intensity of the basic magnetic field and the gyromagnetic ratio. The gyromagnetic ratio of hydrogen nuclei (this is the most frequent application) amounts, for example, to approximately 42 MHz/T.

The magnet systems 1 through 5 are connected to a control and evaluation unit 6 via cables 7 through 11. The magnetic resonance installation is controlled with the control and evaluation unit 6. The cables 7 through 9, which are connected to the shielding magnet 1, the basic magnet 2 and the gradient magnet 3, are ordinary shielded cables. The cables 10, 11, which are connected to the high-frequency coils 4 and to the local coils 5, are as coaxial cables. The control and evaluation unit 6 thus corresponds to the start element described above; the high-frequency coils 4 and the local coils 5 represent the above-described end elements.

Figure 2:
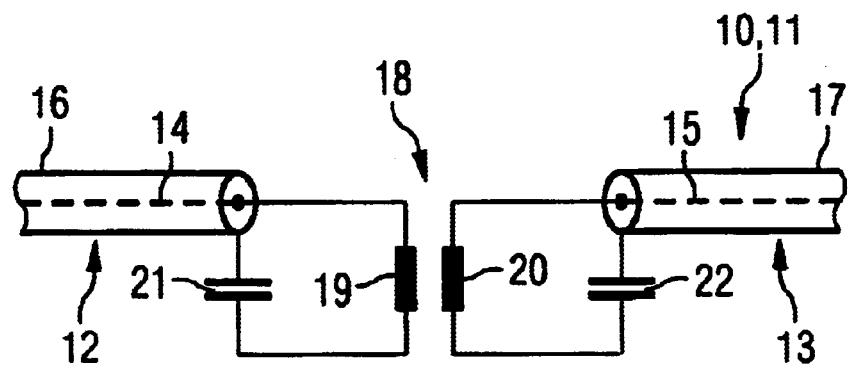
FIG. 2 illustrates the basic principle of an inventive trap.

As shown in FIG. 2, the coaxial cables 10, 11 are each formed of two cable sections 12, 13. Each of the cable sections 12, 13 has an inner conductor 14, 15—indicated with broken lines in FIG. 2—and an outer conductor 16, 17. The cable sections 12, 13 are coupled to one another via a transformer 18. The transformer 18 has transformer coils 19, 20 that are directly connected to the inner conductors 14, 15 and are connected to the outer conductors 16, 17 via tuning capacitors 21, 22.

The inductance of each of the transformer coils 19, 20 is approximately 1.2 $\mu$H; the capacitance of each of the tuning capacitors 21, 22 is approximately 15 pF. Due to this dimensioning, the two transformer halves, each of which is composed of a transformer coil 19 or 20 and a tuning capacitor 21 or 22, respectively form a blocking filter that is approximately tuned to the basic frequency of the high-frequency magnetic field. It was thereby assumed that magnetic resonance signals of hydrogen atoms are to be detected and that the basic magnetic field exhibits a field strength of approximately 1 T.

Figure 3:
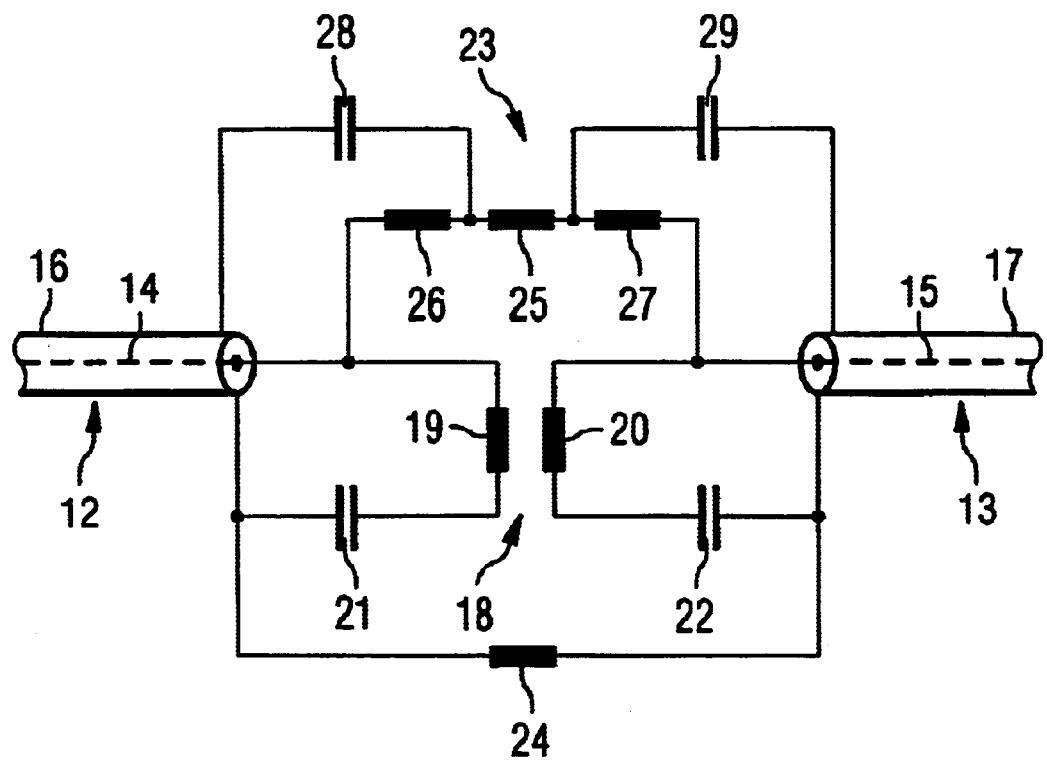
FIG. 3 shows a modification of FIG. 2.

According to the modification of FIG. 3, the inner conductors 14, 15 and the outer conductors 16, 17 are respectively galvanically connected to one another via high-frequency inductances 23, 24. It is thus possible, using this galvanic connection via the coaxial cable 10, 11, to communicate control signals from the control and evaluation unit 6 to the high-frequency coils 4 or the local coils 5 and back. It is thereby assumed that the control signal frequency with which the control signals are communicated is substantially lower than the basic frequency.

The high-frequency inductance 24 via which the outer conductors 16, 17 are galvanically connected to one another exhibits an inductance of approximately 4.7 $\mu$H. The high-frequency inductance 23 galvanically connecting the inner conductors 14, 15 to one another exhibits a middle region 25 and two outside regions 26, 27. The outside regions 26, 27 are connected to the outer conductors 16, 17 via auxiliary capacitors 28, 29. The middle region 25 exhibits an inductance of approximately 4.7 $\mu$H; the outside regions 26, 27 each exhibit an inductance of approximately 10 $\mu$H. The auxiliary capacitors 28, 29 each exhibit a capacitance of approximately 1 nF. The outside regions 26, 27 and the auxiliary capacitors 28, 29 thus also form low-pass filters whose limit frequency lies far below the basic frequency.

The inventive trap is broadband. Neither an exact adherence to the indicated values nor a readjustment are therefore required. It is thus maintenance-free.

Although modifications and changes may be suggested by those skilled in the art, it is the intention of the inventors to embody within the patent warranted hereon all changes and modifications as reasonably and properly come within the scope of the inventors contribution to the art.

We claim as our invention:

1. A magnetic resonance installation comprising:
   a basic field magnet system which generates a basic magnetic field;
   a gradient magnetic field system which generates at least one gradient field superimposed on said basic magnetic field;
   a high-frequency antenna system which emits high frequency signals into, and receives high frequency signals from, a volume within said basic magnetic field;
   a start element and an end element connected by a coaxial cable, said coaxial cable comprising a first cable section and a second cable section each having an inner conductor and an outer conductor; and
   a transformer connected between said first and second cable sections, said transformer having a first transformer coil directly connected to the inner and outer conductors of the first cable section via a first capacitor and having a second transformer coil connected to the inner and outer conductors of the second cable section via a second capacitor.

2. A magnetic resonance installation as claimed in claim 1 wherein said high frequency signals exhibit a basic frequency, and wherein said transformer coils and said tuning capacitors, in combination, form respective frequency filters tuned to said basic frequency.

3. A magnetic resonance installation as claimed in claim 1 further comprising high frequency inductances respective galvanically connecting the respective outer conductors of said cable sections to each other and the respective inner conductors of said cable sections to each other.

4. A magnetic resonance installation as claimed in claim 3 wherein the high-frequency inductance galvanically connecting the respective inner conductors of said cable sections to each other comprises a middle inductive region and two outer inductive regions, and wherein said two outer regions are connected to the respective outer conductors via auxiliary capacitors.

5. A magnetic resonance installation as claimed in claim 4 wherein said high-frequency signal has a basic frequency, and wherein each of said outer inductive regions and the auxiliary capacitor connected thereto forms a low pass filter having a limit frequency that is lower then said basic frequency.

6. A magnetic resonance installation as claimed in claim 3 wherein said high-frequency magnetic signal has a basic frequency, and wherein said coaxial cable carries control signals between said start element and said end element having a control signal frequency that is significantly lower then said basic frequency.

7. A magnetic resonance installation as claimed in claim 6 wherein said start element comprises a control and evaluation unit which generates said control signals and wherein said end element comprises a local coil of said high frequency antenna system.

* * * * *